United States Patent
Cheng et al.

(10) Patent No.: US 6,376,156 B1
(45) Date of Patent: Apr. 23, 2002

(54) PREVENT DEFOCUS ISSUE ON WAFER WITH TUNGSTEN COATING ON BACK-SIDE

(75) Inventors: Kuo-Hsien Cheng; Chen-Peng Fan, both of Hsin-Chu; Chien-Chih Chou, Chu-Pei; Sheng-Yuan Lin, Nan-Tou, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/443,445

(22) Filed: Nov. 22, 1999

(51) Int. Cl.⁷ .............................. G03F 7/00; H01L 21/31
(52) U.S. Cl. ...................... 430/314; 430/313; 430/318; 430/961; 438/778
(58) Field of Search .................................. 430/313, 314, 430/318, 961; 438/778

(56) References Cited

U.S. PATENT DOCUMENTS

| | | | |
|---|---|---|---|
| 4,962,049 A | * 10/1990 | Chang | 437/13 |
| 4,999,317 A | 3/1991 | Lu et al. | 437/189 |
| 5,084,415 A | 1/1992 | Manocha et al. | 437/189 |
| 5,425,846 A | * 6/1995 | Koze | 156/646.1 |
| 6,017,828 A | * 1/2000 | Liao | 438/778 |
| 6,037,233 A | * 3/2000 | Liu | 438/304 |
| 6,191,035 B1 | * 2/2001 | Cheng | 438/680 |
| 6,232,172 B1 | * 5/2001 | Chen et al. | 438/251 |

* cited by examiner

Primary Examiner—Mark F. Huff
Assistant Examiner—Nicole Barreca
(74) Attorney, Agent, or Firm—George O. Saile; Stephen B. Ackerman; Sevgin Oktoy

(57) ABSTRACT

A method is provided to prevent the forming of a high de-focusing ledge or step on the back side of a substrate or a semiconductor wafer in order to improve the photolithographic process steps in semiconductor manufacturing. In semiconductor manufacturing, various processes are performed to form various dielectric and metal layers on the front side of wafers. However, some of these materials deposit on the back side of the wafer as well. These unwanted deposits result in contaminants that break off from the back side, causing reliability problems. Those that do stay on, on the other hand, cause irregular topology, thus affecting the focusing of stepper equipment during photo-lithographic processes. It is disclosed in the present invention a method of forming an oxide layer which prevents the forming of such de-focusing steps on the back side of a wafer.

10 Claims, 2 Drawing Sheets

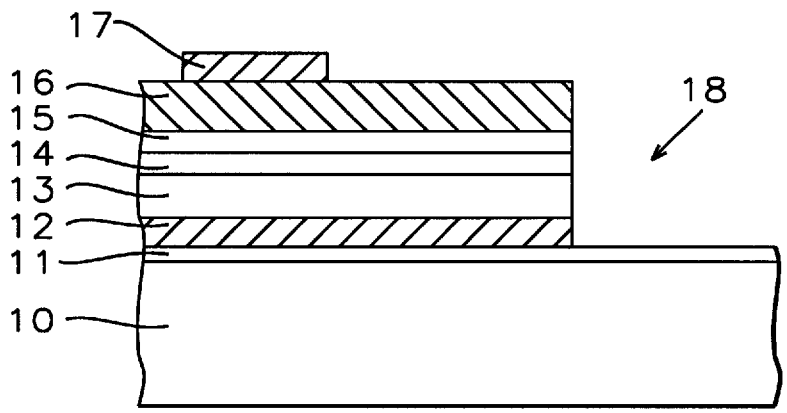
FIG. 1 - Prior Art
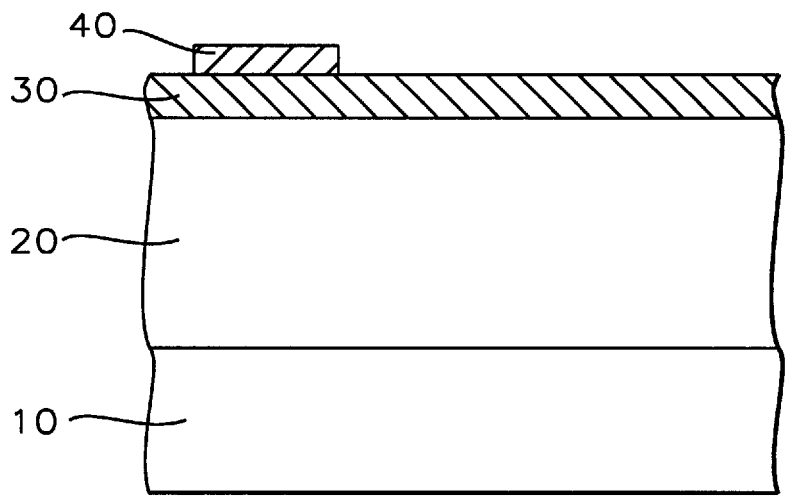
FIG. 2a
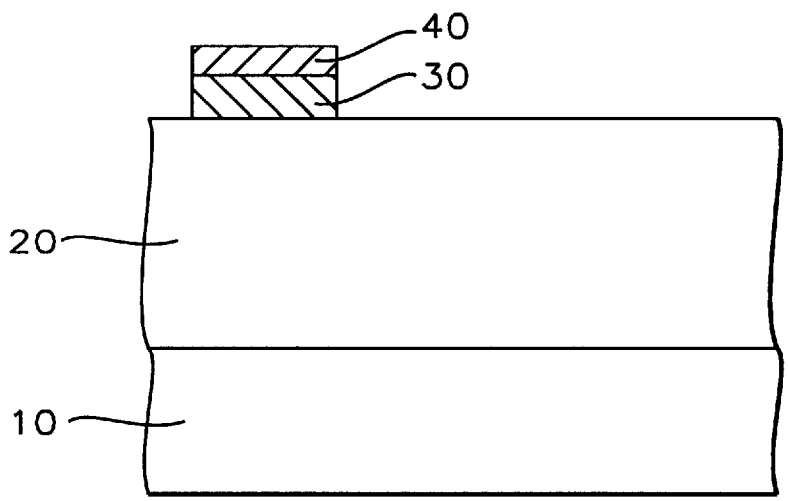
FIG. 2b

US 6,376,156 B1

PREVENT DEFOCUS ISSUE ON WAFER WITH TUNGSTEN COATING ON BACK-SIDE

BACKGROUND OF THE INVENTION (1) Field of the Invention

The present invention relates to the manufacture of integrated circuits in general, and in particular, to a method of preventing tungsten (W) coating on the back side of a wafer during chemical vapor deposition (CVD) of W by growing a thin oxide layer on the wafer back side.

(2) Description of the Related Art

Photolithographic limits in semiconductor manufacturing determine the level of integration that is possible in very large and ultra large scaled integrated circuit, VLSI and ULSI, respectively, technologies. One unwanted contribution to the so-called detrimental de-focus issue of photolithography comes from the environment in which the manufacturing processes are performed. Namely, during the multitude of processes employed in fabricating a semiconductor device on the polished surface of a wafer, the back side (unpolished side) of the wafer can be inadvertently exposed to the same processes as directed upon the front side. In many instances, such exposure is inconsequential since following process operations are tolerant or remedial of such exposure. However, in other process steps, the result of such exposure is detrimental and can prove troublesome in those subsequent processes and can ultimately limit the yield of good semiconductor devices from the wafer. If for example, a particular process step causes large particles to exist on a wafer, the depth-of-field limitations of submicron optical-lithography tools, such as of the well-known stepper, will prevent the patterning of features to the maximum resolution required.

Of the conventional deposition methods, chemical vapor deposition (CVD) is known to generate particulates that collect on the unprotected back side of wafer, especially when depositing tungsten (W) on the front side. As is well known in the industry, tungsten is usually used for metallization of the substrate, where tungsten fluoride ($WF_6$) is reacted with hydrogen ($H_2$) to form W on the front side of the wafer. However, when hydrogen reduction is used for the tungsten process, hydrogen fluoride (HF) vapor is formed, which inadvertently flows to regions at the back side of the wafer. There, additional $WF_6$ reacts with silicon (Si) or polysilicon to form a nucleation layer of tungsten (W) as well as silicon fluoride ($SiF_4$). Continued back side reaction of tungsten fluoride with hydrogen deposits tungsten and produces additional hydrogen fluoride. The HF then reacts with the native oxide which causes additional polysilicon to be exposed to tungsten fluoride ($WF_6$).

Some of these partially coated back side materials become detached in subsequent processes and form particulates which can cause fatal defects in the evolving semiconductor devices. Also, excessive uneven buildup of adhering deposited material on the back side of the wafer can deplanarize the back side, rendering the back side ineffective as a planar datum to assure accurate processing of the front side, such as maintaining a consistent depth of focus during a photolithographic exposure operation.

It is generally known in the art of deposition of metals onto dielectrics that especially adhesion of CVD-tungsten to dielectrics pose difficult problems. It is common practice, therefore, to deposit by sputtering, a "glue" layer. However, while the glue is being deposited onto the front side of the wafer, clips hold the wafer's edge, leaving "clip-marks" on the wafer. Thus, the wafer back side, the wafer edge, and "clip-marks" remain essentially as uncoated dielectric. As a result, subsequently deposited CVD-tungsten material tends to flake off from such uncoated areas in the course of further processing, thereby contaminating processing apparatus and interfering with desired processing. Manocha, et al., in U.S. Pat. No. 5,084,415 address this problem by forming an adhesive or glue layer on the dielectric, forming metal layer, forming a protective layer on a portion of the metal layer, and etching to remove metal not covered by the protective layer, including the edges, back side of the wafer. In a modified approach in U.S. Pat. No. 4,999,317, Lu, et al., propose, prior to metal deposition, first removing the dielectric from the back side, edge, and "clip-mark" areas of the wafer, and second, depositing an adhesive or glue layer on remaining dielectric on the front side, or face, of the wafer. Removal of dielectric material is by etching in the presence of a protective layer on the face of the wafer.

It is also possible to strip the back side of the wafer of the undesirable deposited materials, which is usually a complicated process. Alternatively, it is disclosed in the present invention a method where the back side is protected from the deposition process by forming a thin oxide layer.

SUMMARY OF THE INVENTION

It is therefore an object of the present invention to provide a method of preventing the forming of a de-focusing step on the back side of a substrate or a semiconductor wafer in order to improve the photolithographic process steps in semiconductor manufacturing.

It is another object of this invention to provide a method of forming an oxide layer on the back side of a substrate or a semiconductor wafer in order to prevent the forming of a de-focusing step.

These objects are accomplished by providing a substrate having a front side and a back side; forming a silicon dioxide layer on said back side; forming a polysilicon layer on said front side; forming an unwanted said polysilicon layer on said layer of silicon dioxide on said back side; forming a metal layer on said front side; forming islands of unwanted said metal layer on said polysilicon layer on said back side; forming an oxide layer on said unwanted polysilicon layer on said back side; forming a photoresist mask over said metal layer on said front side; patterning said metal layer on said front side using said photoresist mask; and removing said photoresist mask on said front side by using a photoresist stripper (PRS) without etching into said oxide layer and underlying polysilicon layer as well as the silicon dioxide layer on said back side, thus enabling the next photolithographic step of the manufacturing process without the effect of a defocusing high step on said back side of said substrate.

BRIEF DESCRIPTION OF THE DRAWINGS

FIG. 1 is a partial cross-sectional view of a semiconductor substrate showing the forming of a film stack of materials formed on the front side of a substrate or wafer of prior art.

FIG. 2a is a partial cross-sectional view of a semiconductor substrate showing the forming of an unwanted island of metal over an unwanted layer of polysilicon formed on the back side of a substrate, as practiced in the present manufacturing line.

FIG. 2b is a partial cross-sectional view of a semiconductor substrate showing the etching of the unprotected portion of the polysilicon layer on the back side of the substrate of FIG. 2a, as practiced in the present manufacturing line.

DESCRIPTION OF THE PREFERRED EMBODIMENTS

Figure 2C:
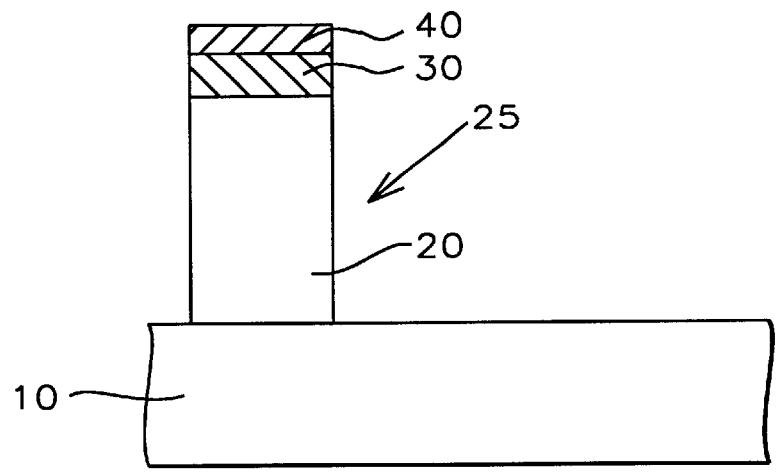
FIG. 2c is a partial cross-sectional view of a semiconductor substrate showing the etching of the unprotected portion of the silicon dioxide layer on the back side of the substrate of FIG. 2b, thus forming a high ledge or "step" as practiced in the present manufacturing line.
Figure 3:
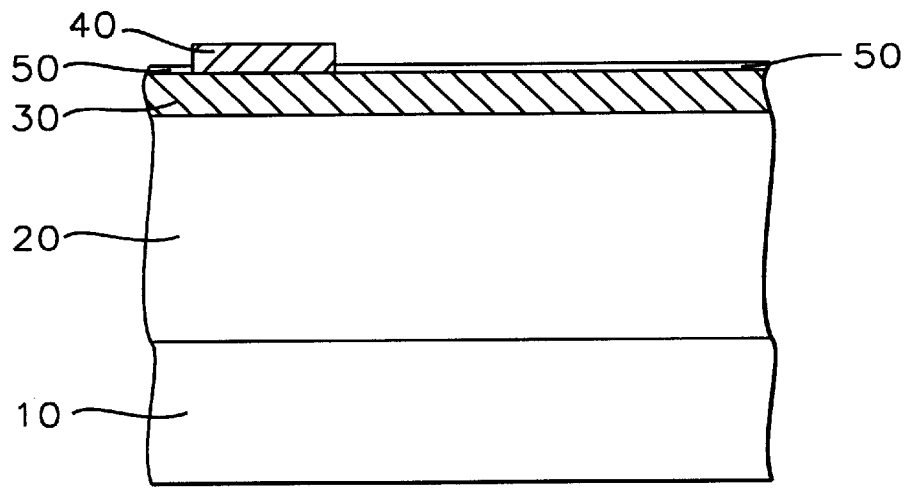
FIG. 3 is a partial cross-sectional view of a semiconductor substrate showing the forming of a protective thin oxide layer over the polysilicon layer on the back side of a substrate, according to the present invention.

Referring now the drawings, FIG. 1 shows a typical set of process steps, including that of forming a metal layer step, that are performed on the front side of a substrate or a wafer in the present manufacturing line. FIGS. 2a–2c show the back side of the same substrate where some of the unwanted materials are also deposited, and the resulting ledge or step that is formed subsequent to various etch steps. The presence of a high step causes defocusing problems with the photolithographic equipment, such as the well-known steppers. FIG. 3, on the other hand, shows the forming of an oxide layer that prevents the forming of a high step, and therefore, the elimination of the problem of defocusing during photolithographic process steps.

More specifically, in FIG. 1, substrate (10), preferably silicon, is shown where, during normal semiconductor processing, various layers are formed on the front side thereof. The layers are shown schematically to indicate as to how they would stack up over an area, not necessarily over a device area, as they are formed at each step in forming a memory cell, for example. These process steps are well known in the art and as they are not together significant to the invention, they are not described in detail here in order not to unnecessarily obscure the present invention. Also for simplicity, the actual structure of the cell is not shown, except for the film stacking of the various layers. However, those steps that are significant to the invention will be disclosed in detail.

Gate oxide layer (11) is formed, usually by a thermal oxidation process at a temperature between about 850° C. to 1100° C. Alternatively, the oxide can be formed by an atmospheric or low pressure chemical vapor deposition process as is well known. The preferred thickness of gate oxide is between about 10 to 1000 Å.

A first polysilicon layer (12) is next formed through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source material at a temperature range between about 600 to 650° C., and to a thickness between about 200 to 5000 Å. First polysilicon layer is usually patterned to form the floating gate of the memory cell.

The patterning is accomplished by first depositing a nitride layer (13) and using it as a hard mask. Nitride layer is formed by reacting dichlorosilane ($SiCl_2H_2$), or silane ($SiH_4$), with ammonia ($NH_3$) in an LPCVD at temperature between about 600 to 800° C. and at a flow rate between about 80 to 120 sccm. Preferably, the thickness of the nitride layer is between about 300 to 3000 Å. Openings (not shown) are formed in nitride layer (13) with an etch recipe comprising gases $O_2$, $SO_2$, $CF_4$ and He at flow rates between about 10 to 250, 10 to 80, 0 to 50 sccm and 40 to 80 sccm, respectively, or in a high density plasma (HDP) etcher in $CF_4$—$O_2$ plasmas. The first polysilicon layer underlying the opening in the nitride layer is also etched using plasma etching, for example in a reactive ion etcher (RIE), with an etchant gas such as hydrogen bromide (HBr), or chlorine ($Cl_2$) and a carrier gas, such as argon (Ar). This results in the selective etching of the polysilicon down to gate oxide layer (11). At a later step, metal will be formed in the openings so formed to serve as contacts to the substrate.

Spacers (not shown) are next formed in the openings by forming an oxide layer (14) and then etching anisotropically. This is followed by the forming of an inter-poly oxide layer (15), preferably, oxide-nitride-oxide (ONO) at a temperature between about 600 to 800° C., and to a thickness between about 500 to 3000 Å. This is followed by the forming of second polysilicon layer (16) shown in FIG. 1, which is then patterned to form the control gate of the memory cell.

Usually metallization of the substrate—to form interconnections between the devices themselves and the circuits at large—is the next step in the fabrication of integrated circuits in semiconductor manufacturing. Metallization is sometimes referred to as "intralevel" when the connections are made between the semiconductor devices themselves, and as "interlevel" when the interconnections are between different levels of wiring in a multi-level substrate. Intralevel connections can be metal or polysilicon, while the interlevel connections are usually metal only. In the present state of the manufacturing line, aluminum, aluminum-copper, and more recently copper alone are the preferred metals for planar metallized layers that are patterned into wiring connections while tungsten is the preferred metal for making vertical connections between the wiring layer. Tungsten is formed by hydrogen reduction methods where tungsten fluoride ($WF_6$) is reacted with hydrogen ($H_2$) to form tungsten (W) to a thickness between about 2000 to 8000 Å.

A film stack of the various materials, including tungsten layer (17), that are formed on the front side of substrate (10) with a relatively high ledge, or, "step" (18) is shown in FIG. 1. Some of these materials, depending upon the method of deposition, also deposit on the back side of the substrate. This is especially true with polysilicon and tungsten deposition. FIG. 2a schematically represents the case of an unwanted layer of polysilicon (30) having been deposited on the back side of substrate (10). The thickness of layer (30) can be between about 200 to 2000 Å. This polysilicon layer is formed over an already formed silicon dioxide layer (20) with a thickness between about 1000 to 3000 Å. Some unwanted tungsten islands (40) are also formed on polysilicon layer (30) on the backside of substrate (10), as shown in FIG. 2a. This is caused by the suction of tungsten fluoride ($WF_6$) to the back side of the wafer where the fluoride reacts with the polysilicon to form a nucleation layer of tungsten (W) as well as silicon fluoride ($SiF_4$). Continued back side reaction of tungsten fluoride with hydrogen deposits tungsten and produces additional hydrogen fluoride (HF). The HF then reacts with the native oxide which causes additional polysilicon to be exposed to tungsten fluoride, and so on.

After the tungsten metallization (17) on the front side of the wafer and after the forming of the tungsten islands (40) on the back side of the wafer, photo resist stripper (PRS) is used to remove the photoresist mask (not shown) that is used to pattern the metallization layer. This also removes the polysilicon layer (30) that is not protected by the tungsten island (40) on the back side of the substrate, as shown in FIG. 2b. Further, silicon dioxide layer (20) is next removed on the back side when wet etch is performed to form openings in insulators for vias and contacts on the front side of the wafer. This results in a very high ledge or "step" (25) with a thickness between about 3000 to 7000 Å, as shown in FIG. 2c with the attendant problem of causing defocusing of the photolithographic equipment in the subsequent manufacturing steps.

Figure 4:
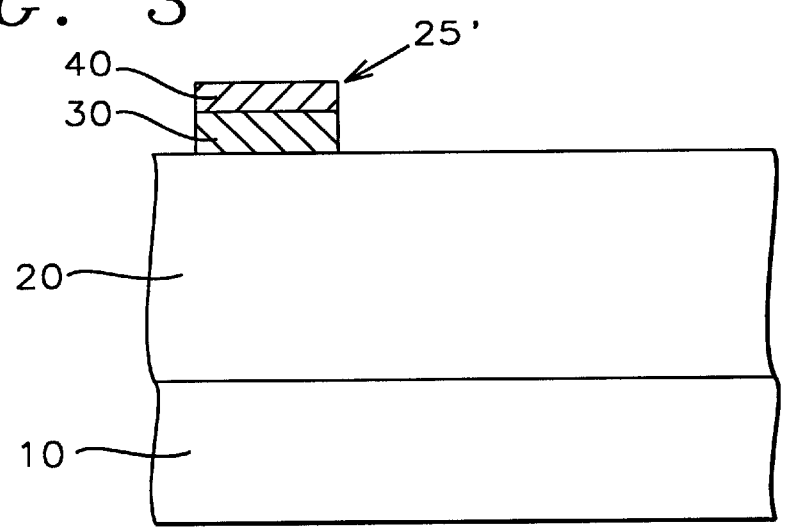
FIG. 4 is a partial cross-sectional view of a semiconductor substrate showing the forming of a shallow "step" on the back side of a substrate during the various process steps performed on the front side of the substrate, according to the present invention.

A main feature and key aspect of the present invention is a method of avoiding the etching of the polysilicon and silicon dioxide layers, namely, layers (20) and (30) in FIGS. 2a–2c, while performing the necessary process steps required on the front side of the substrate. This feature comprises a thin oxide layer that is grown on the polysilicon layer in an oxygen, $O_2$, plasma chamber. Thin oxide layer (50) has a thickness between about 8 to 15 Å, as shown in FIG. 3. It is important that the oxide growth is performed in a chamber with oxygen flow rate between about 20 to 200 sccm, pressure between about 1 to 100 torr, and temperature between about 80 to 200° C. for a duration between about 30 seconds to 5 minutes. Thus, oxide layer (50) protects the underlying polysilicon layer (30) from the photo resist stripper (PRS) during photoresist removal. During the wet etch, the thin oxide layer will be lost, however, only polysilicon layer will be etched during the subsequent via etching step, thus leaving a very shallow ledge, or, step (25') shown in FIG. 4, which will not cause any problems in the focusing of photolithographic equipment. The step height of the disclosed method is between about 50 to 1000 Å.

While the invention has been particularly shown and described with reference to the preferred embodiments thereof, it will be understood by those skilled in the art that various changes in form and details may be made without departing from the spirit and scope of the invention.

What is claimed is:

1. A method of preventing the forming of a defocusing step on the back side of a substrate comprising the steps of:
   providing a substrate having a front side and a back side;
   forming a silicon dioxide layer on said back side;
   forming a polysilicon layer on said front side;
   forming an unwanted polysilicon layer on said layer of silicon dioxide on said back side;
   forming a metal layer on said front side;
   forming islands of unwanted said metal layer on said polysilicon layer on said back side;
   forming a thin oxide layer having a thickness between about 8 to 15 A on said unwanted polysilicon layer on said back side in an oxygen plasma chamber;
   forming a photoresist mask over said metal layer on said front side;
   patterning said metal layer on said front side using said photoresist mask; and
   removing said photoresist mask on said front side by using a photoresist stripper (PRS) without etching into said oxide layer and underlying said unwanted polysilicon layer as well as the silicon dioxide layer on said back side, thus enabling the next photolithographic step of the manufacturing process without the effect of a defocusing high step on said back side of said substrate.

2. The method of claim 1, wherein said substrate is silicon.

3. The method of claim 1, wherein said silicon dioxide layer has a thickness between about 1000 to 3000 Å.

4. The method of claim 1, wherein said polysilicon layer on said front side has a thickness between about 200 to 5000 Å.

5. The method of claim 1, wherein said metal is formed through hydrogen reduction where tungsten fluoride ($WF_6$) is reacted with hydrogen ($H_2$) to form tungsten (W) to a thickness between about 2000 to 8000 Å.

6. The method of claim 1, wherein said thin oxide layer is formed in a chamber with oxygen flow rate between about 20 to 200 sccm, pressure between about 1 to 100 torr, and temperature between about 80 to 200° C. for a duration between about 30 seconds to 5 minutes.

7. A method of preventing the forming of a defocusing step on the back side of a substrate comprising the steps of:
   providing a silicon wafer having a front side and a back side;
   forming a silicon dioxide layer on said back side;
   forming a polysilicon layer on said front side;
   forming an unwanted polysilicon layer on said layer of silicon dioxide on said back side;
   forming a tungsten metal layer on said front side;
   forming islands of unwanted said tungsten metal layer on said polysilicon layer on said back side;
   forming a thin oxide layer having a thickness between about 8 to 15 A on said unwanted polysilicon layer on said back side in an oxygen plasma chamber;
   forming a photoresist mask over said tungsten metal layer on said front side;
   patterning said tungsten metal layer on said front side using said photoresist mask; and
   removing said photoresist mask on said front side by using a photoresist stripper (PRS) without etching into said oxide layer and underlying said unwanted polysilicon layer as well as the silicon dioxide layer on said back side, thus enabling the next photolithographic step of the manufacturing process without the effect of a defocusing high step on said back side of said substrate.

8. The method of claim 7, wherein said tungsten metal is formed to a thickness between about 2000 to 8000 Å by reacting tungsten fluoride ($WF_6$) with hydrogen ($H_2$).

9. The method of claim 7, wherein said unwanted polysilicon layer has a thickness between about 200 to 2000 Å.

10. The method of claim 7, wherein said thin oxide layer is formed in a chamber with oxygen flow rate between about 20 to 200 sccm, pressure between about 1 to 100 torr, and temperature between about 80 to 200° C. for a duration between about 30 seconds to 5 minutes.

* * * * *

UNITED STATES PATENT AND TRADEMARK OFFICE
CERTIFICATE OF CORRECTION

PATENT NO. : 6,376,156 B1
DATED : April 23, 2002
INVENTOR(S) : Kuo-Hsien Cheng, Chen-Peng Fan, Chien-Chih Chou and Sheng-Yuan Lin It is certified that error appears in the above-identified patent and that said Letters Patent is hereby corrected as shown below:

<u>Title page,</u>
Item [74], delete "Sevgin Oktoy" and replace it with -- Sevgin Oktay --.

Signed and Sealed this

Twenty-third Day of July, 2002

*Attest:*

*Attesting Officer*

JAMES E. ROGAN
*Director of the United States Patent and Trademark Office*